United States Patent [19]

Kaarmann et al.

[11] Patent Number: 4,751,013

[45] Date of Patent: Jun. 14, 1988

[54] POROUS PIEZOELECTRIC MATERIAL AND METHOD FOR MAKING IT

[75] Inventors: Hans Kaarmann, Buckenhof; Karl Lubitz, Ottobrunn; Jutta Mohaupt, Munich; Martina Vogt, Fuerth; Wolfram Wersing, Kirchheim, all of Fed. Rep. of Germany

[73] Assignee: Siemens Aktiengesellschaft, Berlin and Munich, Fed. Rep. of Germany

[21] Appl. No.: 759,561

[22] Filed: Jul. 26, 1985

[30] Foreign Application Priority Data

Aug. 16, 1984 [DE] Fed. Rep. of Germany ....... 3430186

[51] Int. Cl.⁴ .................. C04B 35/00; C04B 38/06; B28B 1/26
[52] U.S. Cl. ............................ 252/62.9; 264/44; 264/60; 264/61; 264/66; 501/82; 501/94
[58] Field of Search ............. 264/44, 60, 61, 66; 252/62.9; 501/82, 94

[56] References Cited

U.S. PATENT DOCUMENTS

| | | | |
|---|---|---|---|
| 2,430,013 | 11/1947 | Hansell | 177/386 |
| 2,996,389 | 8/1961 | Fernhof | 264/44 X |
| 3,258,349 | 6/1966 | Scott | 264/44 X |
| 3,470,276 | 9/1969 | Ohno | 264/44 |
| 4,217,684 | 8/1980 | Brisken et al. | 29/25.35 |
| 4,230,589 | 10/1980 | Ogawa | 252/62.9 R |
| 4,234,558 | 11/1980 | Arendt et al. | 252/62.9 R X |
| 4,563,432 | 1/1986 | Ehlert et al. | 264/44 X |

FOREIGN PATENT DOCUMENTS

| | | |
|---|---|---|
| 0119855 | 9/1984 | European Pat. Off. . |
| 3309236 | 9/1984 | Fed. Rep. of Germany . |
| 3309218 | 9/1984 | Fed. Rep. of Germany . |
| 3309234 | 9/1984 | Fed. Rep. of Germany . |
| 900298 | 6/1945 | France . |
| 83530 | 2/1971 | German Democratic Rep. ... 264/44 |
| 131643 | 7/1978 | German Democratic Rep. ... 264/44 |
| 48-77397 | 10/1973 | Japan ........................... 252/62.9 R |
| 2052917 | 1/1981 | United Kingdom . |

OTHER PUBLICATIONS

"Experimentelle Untersuchungen zum Aufbau von Ultraschallbreitbandwandlern", *Biomedizinische Technik*, vol. 27, Book 7-8, pp. 182-185.

*Primary Examiner*—Philip Anderson
*Attorney, Agent, or Firm*—Mark H. Jay

[57] ABSTRACT

A piezoelectric ceramic powder is, together with a binder, processed to a granulate. This granulate is mixed with a pearl polymer to a mixture. The mixture is pressed to a suitable shape, and then in a first firing step the binder and the pearl polymer are fired out. Preferably the first firing process is followed by a second firing step for sintering. Thereafter mechanical fabrication may take place, to give the end product its shape. The firing out of the pearl polymer results in a porous piezoelectric ceramic, with which, when used in an ultrasonic transducer, a high transducer effectiveness, sharp ultrasonic pulses with little edge radiation as well as a good electric and acoustic adaptation can be achieved.

9 Claims, 1 Drawing Sheet

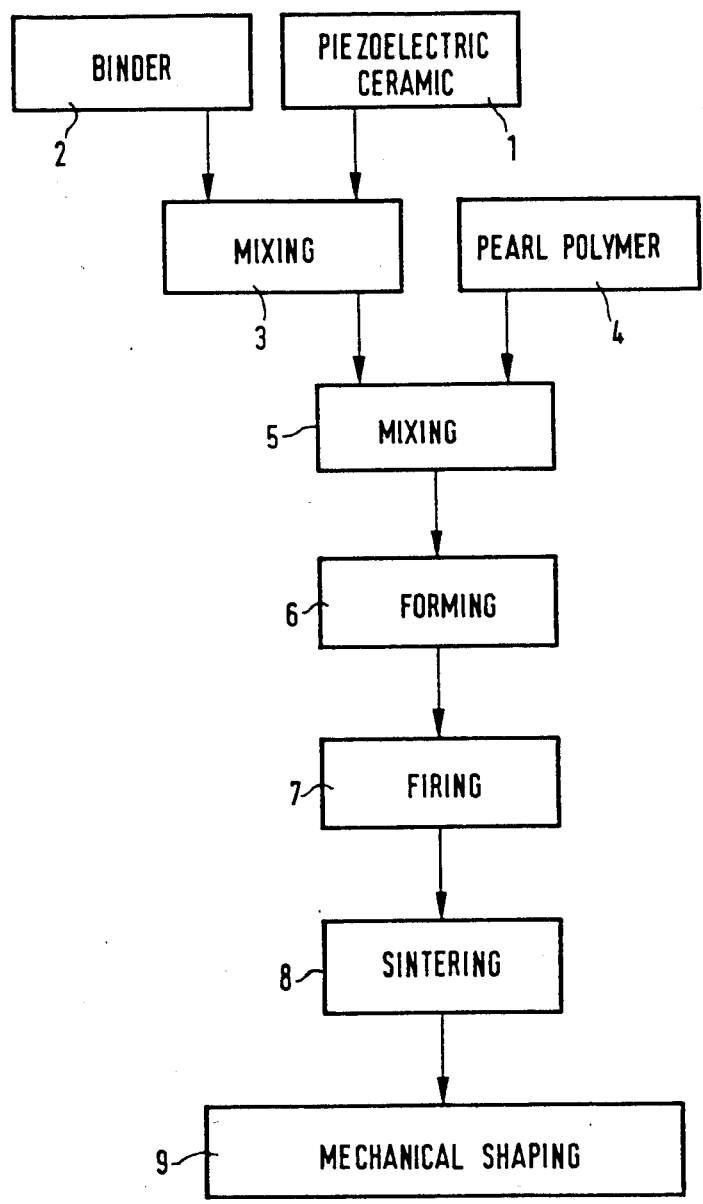

POROUS PIEZOELECTRIC MATERIAL AND METHOD FOR MAKING IT

BACKGROUND OF THE INVENTION

The invention relates to a porous ceramic material having piezoelectric properties, such as is used for ultrasonic applications. The invention relates also to a method for making this material.

For ultrasonic antennas or ultrasonic transducers, e.g. for a linear or a phased array used in medical technology, the ideal piezoelectric material fulfills the following four conditions (a) to (d) simultaneously:

(a) A high transducer effectiveness, i.e. a piezoelectric material with highest possible thickness coupling factor $K_t$;

(b) Precise emission of short pulses without edge radiation to prevent artifacts due to transverse modes, i.e. a piezoelectric material with a minimum transverse coupling $K_p$ or $K_{31}$ and high internal attenuation (i.e. low vibrational Q);

(c) A good electric match between the ultrasonic antenna and the signal line, i.e. the permittivity of the piezoelectric material should be easy to select as a function of the transducer size and frequency; and (d) a good acoustic match to the object to be examined, i.e. in the case of medical technology a good adaptation to (human) tissue, which means that the acoustic impedance of the piezoelectric material should match the acoustic impedance of the object to be examined as closely as possible.

With conventional piezoelectric materials (piezomaterials) the mentioned requirements (a) to (d) can be fulfilled only to a limited extent, and usually at great expense. Thus, as a rule, the piezoelectric material is selected so that conditions (a) and (c) are fulfilled well. Satisfactory results with respect to requirement (b) can be obtained when the individual transducer elements of the ultrasonic antenna are finely divided and that a damping element is applied on the back of the ultrasonic antenna. To fulfill condition (d), an adaptation layer of $\lambda/4$ thickness has been provided between the ultrasonic antenna and the human tissue. Much better results can be obtained with two adaptation layers of $\lambda/4$ thickness, $\lambda$ being the wavelength of the ultrasound.

By using specific piezoceramics such as $PbNb_2O_6$ or low-Q-ceramics (e.g. Vibrit 668), one can fulfill requirement (b) quite well, but allowances must be made for requirements (a) and (c). Adaptation layers are necessary also in this case.

With the use of a piezoelectric plastic ($PVF_2$) the requirements (b) and (d) are fulfilled very well, but the requirements (a) and (c) only moderately so.

Objects of the invention therefore are to provide a porous, piezoelectric ceramic material which fulfills the above requirements (a) to (d) equally well, with relatively low manufacturing costs. The material should be particularly usable in medical ultrasonic technology, but also in other ultrasonic technologies, as for example materials testing.

SUMMARY OF THE INVENTION

According to the invention a pearl polymer is mixed with a piezoelectric ceramic material, and the pearl polymer is fired out later.

By the mixing of pearl polymer with the ceramic piezoelectric material, spaces which are devoid of piezoelectric material are created in the mixture. In the first firing process the pearl polymer is formed out, and the ceramic piezoelectric material is consolidated to the extent that it cannot occupy the cavities which have previously been occupied by the pearl polymer. In this manner, if a suitable ceramic starting material and a suitable pearl polymer are selected, there results a porous piezoelectric material which fulfills the mentioned four requirements (a) to (d) equally well.

In an especially advantageous embodiment, the piezoelectric starting material is in pregranulated form when mixed with the pearl polymer. This causes the mixture to be already conglomerated before it is later shaped. This makes the shaping easier than it would be when using non-pregranulated piezoelectric material.

BRIEF DESCRIPTION OF THE DRAWING

An exemplary and non-limiting preferred embodiment of the invention is shown in the single FIGURE, in which is shown a flow chart in accordance with the invention.

DETAILED DESCRIPTION OF PREFERRED EMBODIMENTS

One starts with a starting material of conventional ceramic powder 1 having piezoelectric properties. For better mutual cohesion of the powder particles, the ceramic powder 1 is mixed with a binder 2 and in so doing further processed to a granulate 3. The ceramic powder 1 is constituted so that in normal processing it would lead to an ordinary ceramic with a thickness coupling factor $K_t=0.5$, with a desired coupling $Q_p$, with a vibrational $Q=200$ and (depending on the desired permittivity) with a dielectric constant $\epsilon$ between 500 and 5000.

The granulate 3 is next mixed with a pearl polymer 4 to form a mixture 5, in particular a pressable mixed granulate. The term "pearl polymer" includes a polymer in the form of small particles, which preferably are round with a central pearl size between 10 and 40 $\mu m$. A value of 20 $\mu m$ has proven to be especially advantageous. Suitable as pearl polymer 4 is in particular polymethyl methacrylate. In principle, of course, any other substance that can be fired out may be selected. The mass proportion of pearl polymer 4 in the mixture 5 is between 10% and 50%, preferably between 10% and 40%, depending on the desired properties of the end product. Mixtures 5 should be as homogeneous as possible, i.e. should have a uniform distribution of ceramic powder 1 and pearl polymer 4.

It is alternatively possible to process the binder 2 later, together with the ceramic powder 1 and pearl polymer 4 in forming the mixture 5. This results in a mixed granulate in which the pearl polymer 4 is also bonded in. It is also possible to entirely dispense with the binder 2.

Another alternative involves processing the ceramic powder 1 to a first slip and the pearl polymer 4 to a second slip and mixing the two slips thereafter. The term "slip" means a liquid suspension of the particles. This can be done with addition of dispersion agents.

Depending on the pretreatment of the ceramic powder 1 and of the pearl polymer 4, different methods (A) to (C) may be used for the production of the mixture 5:

(A) In the embodiment described above, the pearl polymer 4 is mixed in the desired ratio with the pregranulated ceramic powder 3 in mixing equipment, e.g. a ball mill.

(B) For larger quantities, the ceramic powder 1, the binder 2 and the pearl polymer 4 are mixed jointly, and subsequently granulated in a suitable granulating machine, as e.g. a swirl granulator. It is important that the pearl polymer 4 dissolves little (if at all) in the binder 2 used. It is advantageous in this connection if the plastic grains of the pearl polymer 4 constitute nucleation centers for the formation of primary particles which increase in size by surface accumulation.

(C) If the ceramic powder 1 and the pearl polymer 4 are processed to the first and second slip, respectively, before the mixing, a spray tower can be for the production of the mixture 5. There, both slips are atomized in the desired quantity ratio. The two slip streams are brought together just before the spray nozzle, thereby avoiding segregation.

Production of the mixture 5 is followed by shaping it into a desired configuration, as by pressing of the mixture 5 to a rectangular block in a pressing step 6. Depending on the use of the end product, the mixture 5 may be pressed into disks or cylinders, or extruded into tubes.

The shaping or pressing step 6 is followed by a first firing step 7. In this first firing step 7 the relatively high proportion of organic substance, that is, the proportion of pearl polymer 4 and binder 2, is formed out. The temperature and oxygen supply are controlled according to a predetermined program, e.g. 1° C./min to 550° C. and 1.6 liters of oxygen per gram of pearl polymer plus solid binder. After the first firing step 7 the block is obtained with a defined porosity of about 10% to 50%, depending on the quantity of pearl polymer 4 added.

After the first firing step 7 comes a second firing step 8, which advantageously directly follows the first firing step 7 without any intermediate cooling step. This second firing step 8 is carried out under conditions which are optimal for the ceramic material selected, and serves to sinter the porous block, so that its mechanical strength is increased. The porous and sintered block thus treated can now be fabricated by one or several common machining steps 9, such as sawing, grinding, etc., to the desired end product, in the present instance to ultrasonic antennas.

The embodiment described above is preferred for production of pressed parts.

Another embodiment produces piezoelectric ceramic foils of defined porosity by casting or drawing methods known in themselves for ultrasonic transducers which operate at relatively high frequencies (e.g. 5 MHz). To this end, the slip of piezoelectric powder is shaped to a thin foil. To this so-called "foil slip" the pearl polymer 4 is mixed. The pearl polymer 4 may again have preferably a central pearl size of about 20 μm. The pearl polymer 4 must not be soluble in the solvent that is used for slip thinning.

With this embodiment, a segregation may occur between the pearl polymer 4 and the ceramic powder 1 during the drying process (in which the solvent evaporates). Such segregation leads to a density gradient in the fired ceramic foil, i.e. the porosity is higher on one side of the foil than on the other side. This is not necessarily disadvantageous. The gradient can be utilized in a controlled manner in the production of ultrasonic transducers. If the porous ceramic foil with a density gradient is used as an adaptation layer with a thickness of λ/4, an acoustic impedance match over a much wider band is possible than with a homogeneous pore distribution. In this application the high-porosity side faces the layer to be adapted, for instance the human tissue, and the side of lower porosity faces the ultrasonic antenna.

For the desired final form of an ultrasonic transducer to be obtained, the piezoelectric porous ceramic pieces or ceramic bodies are provided with electrodes or electrode structures. This is done using known vapor deposition or sputtering processes.

After application of the electrodes, the porous ceramic pieces or bodies are polarized. Due to the relatively high electric field strength required for polarization, discharge processes may occur in the pores of the ceramic. These discharge processes lead to internal short-circuits and hence to a reduction of the piezoelectric effect. It is therefore advantageous to polarize the porous ceramic pieces under pressure in a protective gas, in particular sulfur hexafluoride ($SF_6$), which can penetrate into the pores.

Further it may be desirable to fill the pores of the ceramic parts with plastic by a known vacuum casting method for their further processing.

With the explained examples the initially mentioned requirements (a) to (d) are fulfilled especially well. As regards (a): The thickness coupling factor $K_t$ approximately equals 0.5 and thus is high enough. Even for normal ceramic this is a good value.

(b): The lateral coupling $K_{31}$ and the vibrational Q of the porous ceramic are very low as compared with ordinary ceramics. The lateral coupling $K_{31}$ is about 0.1 and the vibrational Q approximately 20.

(c): Through the use of diverse piezoelectric ceramic powders as starting material the porous ceramic (end product) can be produced with a permittivity index of about 200 to 1200. Thus a good electric adaptation for nearly all applications in medical technology can be obtained, in particular for ultrasonic antennas (transducers).

(d): In normal piezoelectric ceramics the acoustic impedance is over $30 \times 10^6$ kg/m$^2$s. In the porous ceramic here in question, on the contrary, it can be reduced so low, e.g. to a value of $10 \times 10^6$ kg/m$^2$s, that with a single adaptation layer of λ/4 thickness one obtains just as good an acoustic adaptation as would otherwise, when using non-porous ceramics, be possible only with two adaptation layers of λ/4 thickness. An advantage to be noted in this connection is that the acoustic impedance of the ceramic may, with otherwise practically constant parameters, be selected at different values, namely by varying the quantity of the mixed pearl polymer.

Those skilled in the art will understand that changes may be made in the preferred embodiments here described, and that these embodiments can be used for other purposes. Such changes and uses are within the scope of the invention, which is limited only by the claims which follow.

What is claimed is:

1. A method for producing a porous ceramic material, comprising the steps of:

mixing a pearl polymer having a diameter between 10 μm and 40 μm with powdered piezoelectric ceramic material; and firing the ceramic material mixture with burning out of the pearl polymer to form a porous ceramic material.

2. The method of claim 1, further comprising the step of shaping the mixture before said firing step.

3. The method of claim 1, wherein the piezoelectric ceramic material is in a slip form during said mixing step.

4. The method of claim 1, wherein the pearl polymer is in a slip or suspension form during said mixing step.

5. The method of claim 1, further comprising the step added of further firing the porous ceramic material to form a sintered mixture after said first firing step.

6. The method of claim 1, wherein said mixing step is carried out using 10% to 50% of pearl polymer by mass.

7. The method of claim 5, further comprising the step of polarizing the mixture after subjecting it to said further firing step.

8. The method of claim 7, further comprising the step of introducing an electrically nonconductive gas into the porous ceramic material during said polarizing step.

9. The product produced by the process of claim 1.

* * * * *